(12) United States Patent
Kimura

(10) Patent No.: US 9,156,126 B2
(45) Date of Patent: Oct. 13, 2015

(54) POLISHING PAD

(75) Inventor: Tsuyoshi Kimura, Osaka (JP)

(73) Assignee: TOYO TIRE & RUBBER CO., LTD., Osaka (JP)

( * ) Notice: Subject to any disclaimer, the term of this patent is extended or adjusted under 35 U.S.C. 154(b) by 0 days.

(21) Appl. No.: 14/241,008

(22) PCT Filed: Aug. 24, 2012

(86) PCT No.: PCT/JP2012/071472
§ 371 (c)(1),
(2), (4) Date: Feb. 25, 2014

(87) PCT Pub. No.: WO2013/031692
PCT Pub. Date: Mar. 7, 2013

(65) Prior Publication Data
US 2014/0213151 A1 Jul. 31, 2014

(30) Foreign Application Priority Data
Sep. 1, 2011 (JP) .................. 2011-190859

(51) Int. Cl.
*B24B 49/12* (2006.01)
*B24B 37/22* (2012.01)
*B24B 37/20* (2012.01)
*H01L 21/304* (2006.01)

(52) U.S. Cl.
CPC ............... *B24B 37/205* (2013.01); *B24B 37/22* (2013.01); *H01L 21/304* (2013.01)

(58) Field of Classification Search
CPC ...... B24B 49/12; B24B 37/205; B24B 37/22; H01L 21/304
USPC .............................. 451/6, 533, 534, 526, 527
See application file for complete search history.

(56) References Cited

U.S. PATENT DOCUMENTS

| | | | |
|---|---|---|---|
| 6,358,130 B1 | 3/2002 | Freeman et al. | |
| 6,454,630 B1 | 9/2002 | Tolles | |
| 6,524,164 B1 | 2/2003 | Tolles | |

(Continued)

FOREIGN PATENT DOCUMENTS

| | | | |
|---|---|---|---|
| CN | 1569398 A | 1/2005 | |
| JP | 2001-291686 A | 10/2001 | |

(Continued)

OTHER PUBLICATIONS

A Notification of Examination Opinions with Search Report issued by Taiwan Intellectual Property Office on Sep. 22, 2014 for Taiwan counterpart application No. 101131547.

(Continued)

*Primary Examiner* — Robert Rose
(74) *Attorney, Agent, or Firm* — Law Office of Katsuhiro Arai

(57) ABSTRACT

An object of the invention is to provide a polishing pad that is prevented from slurry leaks and has high optical detection accuracy. The present invention relates to a polishing pad comprising a polishing region, a cushion layer, and a support film layered in this order, wherein a light-transmitting region is provided on the support film and in an opening part that passes through the polishing region and the cushion layer; the light-transmitting region has a peripheral part and a recessed part on the surface of a polishing platen-side; the support film is layered on the peripheral part; and the support film is not layered on the recessed part, which remains open.

6 Claims, 1 Drawing Sheet

(56) References Cited

U.S. PATENT DOCUMENTS

| | | | |
|---|---|---|---|
| 6,855,034 B2* | 2/2005 | Hasegawa | 451/41 |
| 6,984,163 B2* | 1/2006 | Roberts | 451/6 |
| 7,018,581 B2* | 3/2006 | David et al. | 264/235 |
| 7,306,507 B2* | 12/2007 | Benvegnu et al. | 451/6 |
| 7,621,798 B1* | 11/2009 | Bennett et al. | 451/6 |
| 2002/0137431 A1* | 9/2002 | Labunsky et al. | 451/6 |
| 2003/0109197 A1 | 6/2003 | Tolles | |
| 2003/0171070 A1 | 9/2003 | Tolles | |
| 2004/0082287 A1* | 4/2004 | Wright et al. | 451/490 |
| 2004/0224611 A1 | 11/2004 | Aoi et al. | |
| 2004/0235392 A1 | 11/2004 | Ohta | |
| 2004/0248501 A1* | 12/2004 | Kim et al. | 451/6 |
| 2006/0154568 A1 | 7/2006 | Tolles | |
| 2010/0099344 A1 | 4/2010 | String et al. | |

FOREIGN PATENT DOCUMENTS

| | | |
|---|---|---|
| JP | 2003-068686 A | 3/2003 |
| JP | 2003-510826 A | 3/2003 |
| JP | 2004-327779 A | 11/2004 |
| JP | 2004-343090 A | 12/2004 |
| JP | 2008-101089 A | 5/2008 |
| JP | 2010-099828 A | 5/2010 |

OTHER PUBLICATIONS

Notification of Transmittal of Translation of the International Preliminary Report on Patentability (PCT/IB/338) mailed Mar. 13, 2014, with International Preliminary Report on Patentability (PCT/IB/373) and Written Opinion of the International Searching Authority (PCT/ISA/237), for corresponding international application PCT/JP2012/071472.

International Search Report (ISR) mailed Sep. 18, 2012, issued for International application No. PCT/JP2012/071472.

A Notification of Reasons for Refusal issued by the Japanese Patent Office, mailed Jan. 14, 2015, for Japanese counterpart application No. 2011-190859.

An Office Action issued by Korean Intellectual Property Office, mailed Jun. 26, 2015, for Korean counterpart application No. 1020147007404.

An Office Action issued by the State Intellectual Property Office of China, mailed Jun. 4, 2015, with a search report for Chinese counterpart application No. 2012800414330.

* cited by examiner

POLISHING PAD

This application is the U.S. National Phase under 35 U.S.C. §371 of International Application PCT/JP2012/071472, filed Aug. 24, 2012, which claims priority to Japanese Patent Application No. 2011-190859, filed Sep. 1, 2011. The International Application was published under PCT Article 21(2) in a language other than English.

TECHNICAL FIELD

The present invention relates to a polishing pad used in planarizing an uneven surface of a material to be polished, such as a semiconductor wafer, by chemical mechanical polishing (CMP) and in particular to a polishing pad having a window (light-transmitting region) for detection of a polished state or the like by optical means, as well as a method for producing a semiconductor device by using the polishing pad.

BACKGROUND ART

Production of a semiconductor device involves a step of forming an electroconductive film on a surface of a semiconductor wafer (hereinafter also referred to as a wafer) to form a wiring layer by photolithography, etching or the like; a step of forming an interlaminar insulating film on the wiring layer; and the like; and an uneven surface made of an electroconductive material such as metal and an insulating material is formed on the surface of a wafer by these steps. In recent years, processing for fine wiring and multilayer wiring have been advancing for the purpose of higher integration of semiconductor integrated circuits, and accordingly techniques of planarizing an uneven surface of a wafer have become important.

As the method of planarizing an uneven surface of a wafer, a CMP method is generally used. CMP is a technique in which while the surface of a wafer to be polished is pressed against a polishing surface of a polishing pad, the surface of the wafer is polished with an abrasive in the form of slurry having abrasive grains dispersed therein (hereinafter, referred to as slurry).

As shown in FIG. 1, a polishing apparatus used generally in CMP is provided, for example, with a polishing platen 2 for supporting a polishing pad 1; a supporting stand (polishing head) 5 for supporting a polished material (wafer) 4; a backing material for uniformly pressurizing a wafer; and a mechanism of feeding an abrasive 3. The polishing pad 1 is fitted with the polishing platen 2, for example, by sticking with a double-sided tape. The polishing platen 2 and the supporting stand 5 are provided with rotating shafts 6 and 7, respectively, and are arranged such that the polishing pad 1 and the polished material 4, both of which are supported by them, are opposed to each other. The supporting stand 5 is provided with a pressurizing mechanism for pressing the polished material 4 against the polishing pad 1.

When such CMP is conducted, there is a problem of judging the planarity of wafer surface. That is, the point in time when desired surface properties or planar state are reached is required to be detected. With respect to the thickness of an oxide film, polishing speed and the like, the following has been conventionally conducted that a test wafer is periodically treated, the results are confirmed, and thereafter a wafer to be a product is subjected to a polishing treatment.

In this method, however, the treatment time of a test wafer and the cost for the treatment are wasteful, and the test wafer not subjected to processing at all in advance and a product wafer are different in polishing results due to a loading effect unique to CMP, and accurate prediction of processing results is difficult without actual processing of the product wafer.

Accordingly, there has been a need in recent years for a method capable of in situ detection of the point in time when desired surface properties and thickness are attained at the time of CMP processing, in order to solve the problem described above. In such detection, various methods are used. From the viewpoints of measurement accuracy and spatial resolution in non-contract measurement, optical detection means comes to be used mainly.

The optical detection means is specifically a method of detecting the end-point of polishing by irradiating a wafer via a polishing pad through a window (light-transmitting region) with light beam, and monitoring interference signal generated by reflection of the light beam.

In such method, the endpoint is determined by knowing an approximate depth of surface unevenness by monitoring a change in the thickness of a surface layer of a wafer. When such change in thickness becomes equal to the thickness of unevenness, the CMP process is finished. As a method of detecting the endpoint of polishing by such optical means and a polishing pad used in the method, various methods and polishing pads have been proposed.

Besides, a proposal is also offered for preventing a slurry from leaking out an interface (joint line) between a polishing region and a light-transmitting region (Patent Document 1 and 2).

Further, in order to prevent slurry leakage, there is disclosed a method for interposing, between an upper-layer pad and a lower-layer pad, a transparent film with an adhesive agent applied to upper and lower surfaces thereof (Patent Document 3). However, if an adhesive layer is interposed between a light-transmitting region and the transparent film, there is fear that the optical detection accuracy also decreases because of a reduction in light transmittance.

In addition, in order to prevent slurry leakage, there is disclosed a polishing pad, wherein a polishing layer and a porous subpad layer are laminated; a light transmissive window is disposed within the internal opening part between the polishing layer and the porous subpad layer; and a pressure-sensitive adhesive layer is attached to the bottom surface of the porous subpad layer and the light transmissive window (Patent Document 4). However, if there is a pressure-sensitive adhesive layer on the bottom surface of the light transmissive window, the same problem as above occurs.

Moreover, in order to prevent slurry leakage and improve optical detection accuracy, there is disclosed a lengthy polishing pad which is provided with a space between a light-transmitting region and a transparent support film (Patent Document 5). However, if there is a transparent support film on the bottom surface of the light-transmitting region, the same problem as above occurs.

PRIOR ART DOCUMENTS

Patent Documents

Patent Document 1: JP-A-2001-291686
Patent Document 2: JP-A-2003-510826
Patent Document 3: JP-A-2003-68686
Patent Document 4: JP-A-2010-99828
Patent Document 5: JP-A-2008-101089

SUMMARY OF THE INVENTION

Problems to be Solved by the Invention

An object of the invention is to provide a polishing pad that is prevented from slurry leaks and has high optical detection accuracy.

Means for Solving the Problems

As a result of investigations to solve the above problems, the inventors have made the invention based on the finding that the object can be achieved using the polishing pad described below.

That is, the present invention relates to a polishing pad comprising a polishing region, a cushion layer, and a support film layered in this order, wherein a light-transmitting region is provided on the support film and in an opening part that passes through the polishing region and the cushion layer;

the light-transmitting region has a peripheral part and a recessed part on the surface of a polishing platen-side;

the support film is layered on the peripheral part; and the support film is not layered on the recessed part, which remains open.

It is preferable to provide a covering member on the side surface of the recessed part. Further, the covering member is preferably formed by bending an end part of the support film laminated in the peripheral part. This makes it possible to certainly prevent slurry leakage.

The present invention also relates to a method for producing a semiconductor device, the method including the step of polishing a surface of a semiconductor wafer using the polishing pad.

Effect of the Invention

Because the polishing pad of the present invention has a structure such that the peripheral part is provided in the surface of the polishing platen-side of the light-transmitting region and the support film is laminated in the surface of the polishing platen-side of the cushion layer, slurry leakage can be prevented by the support film even if a slurry leaks from the boundary between the polishing region and the light-transmitting region and from the boundary between the cushion layer and the light-transmitting region. Further, a recessed part is provided on the surface of the polishing platen-side of the light-transmitting region, and the recessed part is open because a member such as an adhesive layer or a film is not layered thereon. Accordingly, it is possible to prevent a reduction in light transmittance so that optical detection accuracy can be improved. Moreover, it is possible to protrude an optical detection device from the surface of the polishing platen so that the device can be closer to the recessed part in the light-transmitting region. As a result, optical detection accuracy can be more improved because the distance between the material (wafer) to be polished and the optical detection device can be shortened.

MODE FOR CARRYING OUT THE INVENTION

Figure 2:
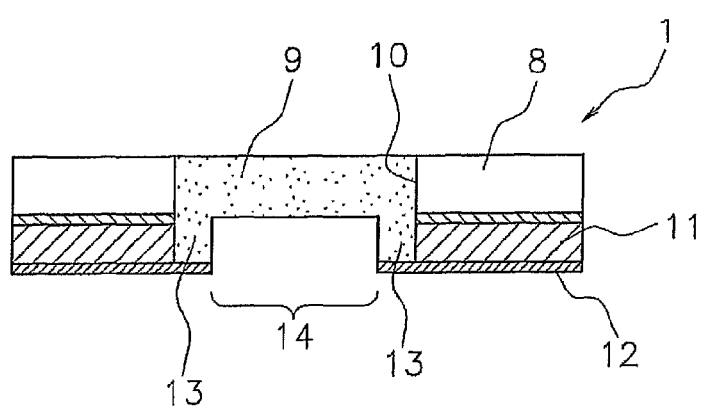
FIG. 2 is a schematic sectional view showing one example of a structure of the polishing pad of the present invention.

FIG. 2 is a schematic sectional view showing one example of a structure of the polishing pad of the present invention. As shown in FIG. 2, in a polishing pad 1 of the present invention, a polishing region 8, a cushion layer 11, and a support film 12 are layered in this order, and a light-transmitting region 9 is provided on the support film 12 and in an opening part 10 that passes through the polishing region 8 and the cushion layer 11. The light-transmitting region 9 has a peripheral part 13 and a recessed part 14 in the surface of the polishing platen-side, and the support film 12 is layered on the peripheral part 13, and the support film 12 is not layered on the recessed part 14, which remains open.

There is no particular limitation on a material for forming the light-transmitting region 9. The material to be used is preferably a material which enables optical end-point detection with high accuracy in a state where polishing is carried out and has a light transmittance of 20% or more, and more preferably 50% or more, over the entire range of 400 to 700 nm in wavelength. Examples of such a material include thermosetting resins such as a polyurethane resin, a polyester resin, a phenol resin, a urea resin, a melamine resin, an epoxy resin and an acrylic resin; thermoplastic resins such as a polyurethane resin, a polyester resin, a polyamide resin, a cellulose-based resin, an acrylic resin, a polycarbonate resin, a halogen containing resin (polyvinyl chloride, polytetrafluoroethylene, polyvinylidene fluoride and the like), polystyrene, and an olefinic resin (polyethylene, polypropylene and the like); rubbers such as a butadiene rubber and an isoprene rubber; photocurable resins curable with irradiation of light such as ultraviolet light and an electron beam; and photosensitive resins. The resins may be used alone or in combination of two or more kinds thereof.

The material to be used in the light-transmitting region 9 is preferably a material more excellent in cutting property than the material to be used in the polishing region 8. The term, cutting property, means a level at which the material is cut during polishing by a material to be polished or a dresser. In the above case, the light-transmitting region 9 does not protrude from the polishing region 8 and a scratch on a material to be polished or a dechuck error during polishing can be prevented.

The material to be used in the light-transmitting region 9 is preferably the material used in the polishing region 8 or a material analogous to the material used in the polishing region 8 in physical properties. Particularly preferred is a polyurethane resin having a high wear resistance, which can suppress light scattering in the light-transmitting region 9 due to dressing marks during polishing.

The polyurethane resin is made of an isocyanate component, a polyol (high-molecular-weight polyol and low-molecular-weight polyol) component and a chain extender.

Examples of the isocyanate component include 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate, m-xylylene diisocyanate, hexamethylene diisocyanate, 1,4-cyclohexane diisocyanate, 4,4'-dicyclohexylmethane diisocyanate and isophorone diisocyanate. These may be used alone or in combination of two or more kinds thereof.

Examples of the high-molecular-weight polyol include polyether polyols represented by polytetramethylene ether glycol, polyester polyols represented by polybutylene adipate, polyester polycarbonate polyols exemplified by reaction products of polyester glycols such as polycaprolactone polyol and polycaprolactone with alkylene carbonate, polyester polycarbonate polyols obtained by reacting ethylene carbonate with a polyhydric alcohol and reacting the resulting reaction mixture with organic dicarboxylic acid, and polycarbonate polyols obtained by ester exchange reaction of a polyhydroxyl compound with aryl carbonate. These may be used alone or in combination of two or more kinds thereof.

The polyol includes not only the above high-molecular-weight polyols but also low-molecular-weight polyols such as ethylene glycol, 1,2-propylene glycol, 1,3-propylene glycol, 1,4-butane diol, 1,6-hexane diol, neopentyl glycol, 1,4-cyclohexane dimethanol, 3-methyl-1,5-pentane diol, diethylene glycol, triethylene glycol and 1,4-bis(2-hydroxyethoxy)benzene.

Examples of the chain extender include low-molecular-weight polyols such as ethylene glycol, 1,2-propylene glycol, 1,3-propylene glycol, 1,4-butane diol, 1,6-hexane diol, neopentyl glycol, 1,4-cyclohexane dimethanol, 3-methyl-1,5-pentane diol, diethylene glycol, triethylene glycol and 1,4-bis(2-hydroethoxy)benzene; and polyamines such as 2,4-toluene diamine, 2,6-toluene diamine, 3,5-diethyl-2,4-toluene diamine, 4,4'-di-sec-butyl-diaminodiphenyl methane, 4,4'-diaminodiphenyl methane, 3,3'-dichloro-4,4'-diaminodiphenyl methane, 2,2',3,3'-tetrachloro-4,4'-diaminodiphenyl methane, 4,4'-diamino-3,3'-diethyl-5,5'-dimethyl diphenyl methane, 3,3'-diethyl-4,4'-diaminodiphenyl methane, 4,4'-methylene-bis-methyl anthranylate, 4,4'-methylene-bis-anthranylic acid, 4,4'-diaminodiphenyl sulfone, N,N'-di-sec-butyl-p-phenylene diamine, 4,4'-methylene-bis(3-chloro-2,6-diethylaniline), 3,3'-dichloro-4,4'-diamino-5,5'-diethyl diphenyl methane, 1,2-bis(2-aminophenylthio)ethane, trimethylene glycol-di-p-aminobenzoate and 3,5-bis(methylthio)-2,4-toluene diamine. These may be used alone or in combination of two or more kinds thereof. However, since such polyamines are often colored by themselves and resins formed by using the same are also often colored, polyamines are blended preferably in such a range that physical properties and light transmittance do not deteriorate. When the compound having an aromatic hydrocarbon group is used, the light transmittance in the short-wavelength side tends to decrease, and thus such a compound is particularly preferably not used. In the case of a compound in which an electron-donating group such as a halogen group and a thio group or an electron-withdrawing group is attached to an aromatic ring, the light transmittance tends to decrease, and thus such a compound is particularly preferably not used, provided that the compound may be blended in such a range that the required transmittance in the short-wavelength side does not deteriorate.

The proportion of the isocyanate component, the polyol component and the chain extender in the polyurethane resin can be appropriately changed depending on their respective molecular weights, desired physical properties in the light-transmitting region produced therefrom, and the like. The ratio of the number of isocyanate groups in the organic isocyanate to the number of functional groups in total (hydroxyl group+amino group) in the polyol and the chain extender is preferably 0.95 to 1.15, and more preferably 0.99 to 1.10. The polyurethane resin can be produced by known urethane-making techniques such as a melting method and a solution method, but in consideration of cost and working environment, the polyurethane resin is preferably produced by the melting method.

The polymerization procedure for the polyurethane resin can be either a prepolymer method or a one shot method and, from the viewpoints of stability and transparency of the polyurethane resin upon polishing, preferable is the prepolymer method in which an isocyanate terminated prepolymer is synthesized from an organic isocyanate and a polyol in advance, and a chain extender is reacted with the prepolymer. An NCO weight % of the prepolymer is preferably in the range of about 2 to 8 weight %, and more preferably, in the range of about 3 to 7 weight %. When the NCO weight % is less than 2 weight %, reaction curing takes an excessively long time to tend to reduce productivity, while when the NCO weight % exceeds 8 weight %, a reaction velocity is excessively fast to thereby cause incorporation of air, or the like, thereby tending to deteriorate physical characteristics such as transparency and light transmittance. When there are air bubbles in the light-transmitting region, decay of reflected light becomes significant due to light scattering, thereby reducing polishing end-point detection accuracy and film thickness measurement accuracy. Accordingly, in order to remove such air bubbles to make the light-transmitting region without air bubbles, a gas contained in the material is preferably sufficiently removed under reduced pressure at 10 Torr or less before mixing of the material. In the case of a usually used stirring blade mixer, the mixture is stirred at a rotation number of 100 rpm or less so as not to permit air bubbles to be incorporated into it in the stirring step after mixing. The stirring step is also preferably conducted under reduced pressure. When a rotation revolution mixer is used, air bubbles are hardly mixed even in high rotation, and thus a method of stirring and deforming by using this mixer is also preferable.

There is no particular limitation on the method of preparing the light-transmitting region, and the light-transmitting region can be prepared according to known methods. For example, a method wherein a block of the polyurethane resin produced by the method described above is cut in a predetermined thickness by a slicer in a bandsaw system or a planing system, a method that involves casting a resin into a mold having a cavity of predetermined thickness and then curing the resin, an injection molding method, a method of using coating techniques and sheet molding techniques, and the like are used.

The light-transmitting region 9 has the peripheral part 13 and the recessed part 14 on one surface. There is no particular limitation on the method for forming the recessed part 14, and examples thereof include a method for forming a recessed part by cutting the surface of the light-transmitting region prepared by the method described above, a method for directly preparing a light-transmitting region having a recessed part by an injection molding method or casting molding method, and the like.

There is no particular limitation on the shape and size of the light-transmitting region 9, but its shape and size are preferably similar to the shape and size of the opening part 10 of the polishing region 8 and the cushion layer 11. In the case of preparation of a lengthy polishing pad, a lengthy light-transmitting region may be used.

The shape and size of the peripheral part 13 and the recessed part 14 may be appropriately adjusted in consideration of the shape and size of the light-transmitting region 9, but the width of the peripheral part 13 is preferably 1 mm or more because it is necessary to fix the light-transmitting region 9 on the support film 12 by the peripheral part 13.

There is no particular limitation on the thickness of the light-transmitting region 9, but it is preferable that the thickness thereof is equal to or less than the surface of the polishing region 8 when the light-transmitting region 9 is provided in the opening part 10. When the light-transmitting region 9 is protruded from the surface of the polishing region 8, there is fear that a protruding part during polishing may damage the wafer. On the other hand, if the thickness is too thin, a large recessed part occurs on the upper surface of the light-transmitting region 9 to collect a lot of slurry, thereby to cause fear to reduce optical end-point detection accuracy. Therefore, when the light-transmitting region 9 is provided in the opening part 10, the difference in height between the surface of the polishing region 8 and the surface of the light-transmitting region 9 is preferably 500 µm or less.

The depth of the recessed part 14 is not particularly limited, but it is preferable that such a depth is equal to or less than the thickness of the cushion layer 11 in order to make the lifetime of the light-transmitting region 9 equal to the lifetime of the polishing region 8.

The surface roughness Ra of the recessed part 14 is preferably 10 µm or less in order to suppress the irregular reflection of light.

The Asker D hardness of the light-transmitting region 9 is preferably 30 to 60 degrees. Use of the light-transmitting region of the hardness enables suppression of generation of scratch on the wafer surface and deformation of the light-transmitting region. It is also possible to suppress generation of scar on the light-transmitting region surface, thereby making it possible to stably carry out optical end-point detection with high accuracy. The Asker D hardness of the light-transmitting region is preferably 30 to 50 degrees.

The polishing side surface of the light-transmitting region 9 and the surface of the recessed part 14 may be roughened in advance. This makes it possible to suppress changes in the light transmittance of the light-transmitting region during use, and when program corresponding to the initial light transmittance (optical reflectance) is used to detect the end-point, it is possible to prevent an end-point detection error due to changes in light transmittance from the early stage to the final stage of the use of the polishing pad.

Examples of the method for roughening the surface include 1) a method for subjecting one surface of a resin sheet to sand blasting, surface texturing (embossing), etching, corona discharge treatment, laser irradiation treatment, or the like; 2) a method for performing injection molding or molding with a textured die; 3) a method for forming a pattern on one surface of a resin sheet when being formed by extrusion; 4) a method for forming a pattern on one surface of a resin sheet with a metal roll, a rubber roll or an embossing roll having a given surface shape; 5) a method for performing buffing with an abrasive material such as sandpaper; and the like.

Examples of the material for forming the polishing region 8 include a polyurethane resin, a polyester resin, a polyamide resin, an acrylic resin, a polycarbonate resin, a halogenated resin (polyvinyl chloride, polytetrafluoroethylene, polyvinylidene fluoride or the like), polystyrene, an olefinic resin (polyethylene, polypropylene or the like), an epoxy resin and a photosensitive resin. These may be used alone or in combination of two or more kinds thereof. The material for forming the polishing region may have the composition which is the same as or different from that of the light-transmitting region, and is preferably the same material as that used for forming the light-transmitting region.

The polyurethane resin is a particularly preferable material as the material for forming the polishing region because it is excellent in abrasion resistance and can be used for easily obtaining a polymer having desired physical properties by changing the composition of raw materials.

There is no particular limitation on the isocyanate component used and, for example, the isocyanate component described above can be mentioned.

There is no particular limitation on the high-molecular-weight polyol used and, for example, the high-molecular-weight polyol described above can be mentioned. There is no particular limitation on the number-average molecular weight of the high-molecular-weight polyol, and the number-average molecular weight is preferably about 500 to 2,000 from the viewpoint of the elastic characteristics of the resulting polyurethane. When the number-average molecular weight is less than 500, the polyurethane obtained therefrom does not have sufficient elastic characteristics, thus becoming a brittle polymer. Accordingly, a polishing region produced from this polyurethane is too rigid and can cause scratch on the wafer surface. Further, because of easy abrasion, such polyurethane is not preferable from the viewpoint of the lifetime of the pad. In contrast, when the number-average molecular weight is more than 2000, polyurethane obtained therefrom becomes too soft, and thus a polishing region produced from this polyurethane tends to be inferior in planarizing property.

As the polyol, not only the high-molecular-weight polyols mentioned above, but also the low-molecular-weight polyols mentioned above can be used in combination.

Examples of the chain extender include polyamines such as 4,4'-methylene bis(o-chloroaniline) (MOCA), 2,6-dichloro-p-phenylenediamine, 4,4'-methylene bis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethyleneoxide-di-p-aminobenzoate, 1,2-bis(2-aminophenylthio)ethane, 4,4'-diamino-3,3'-diethyl-5,5'-dimethyldiphenylmethane, N,N'-di-sec-butyl-4,4'-diaminodiphenylmethane, 4,4'-diamino-3,3'-diethyldiphenylmethane, 4,4'-diamino-3,3'-diethyl-5,5'-dimethyldiphenylmethane, 4,4'-diamino-3,3'-diisopropyl-5,5'-dimethyldiphenylmethane, 4,4'-diamino-3,3',5,5'-tetraethyldiphenylmethane, 4,4'-diamino-3,3',5,5'-tetraisopropyldiphenylmethane, m-xylylenediamine, N,N'-di-sec-butyl-p-phenylenediamine, m-phenylenediamine and p-xylylenediamine; and the low-molecular-weight polyol components described above. These may be used alone or in combination of two or more kinds thereof.

The proportion of the isocyanate component, the polyol and the chain extender in the polyurethane resin can be suitably changed depending on their respective molecular weights, desired physical properties of the polishing region produced therefrom and the like. To obtain the polishing region excellent in polishing characteristics, the ratio of the number of isocyanate groups in the isocyanate component to the number of functional groups in total (hydroxyl group+ amino group) in the polyol and the chain extender is preferably 0.95 to 1.15, and more preferably 0.99 to 1.10.

The polyurethane resin can be produced by the same method as described above. To the polyurethane resin, a stabilizer such as an antioxidant, a surfactant, a lubricant, a pigment, a filler such as hollow beads, water-soluble particles or emulsion particles, an antistatic agent, abrasive grains and other additives may be optionally added.

The polishing region is preferably made of fine-cell foam. When the fine-cell foam is used, slurry can be retained on fine pores of the surface to increase the rate of polishing.

Examples of the method of finely foaming the polyurethane resin include, but are not limited to, a method of adding hollow beads, a mechanical foaming method and a chemical foaming method. These methods may be used in combination, and a mechanical foaming method using a silicone-based surfactant which is a polyalkyl siloxane/polyether copolymer is particularly preferable. As the silicone-based surfactant, SH-192 and L-5340 (manufactured by Toray Dow Corning Silicone Co., Ltd.) can be mentioned as a preferable compound.

An example of the method of producing fine cell polyurethane foam will be described below. The method of producing such polyurethane foam has the following steps.

1) Foaming Step of Preparing Air Bubble Dispersion of Isocyanate-Terminated Prepolymer A silicone-based surfactant is added to an isocyanate-terminated prepolymer (first component) followed by stirring in the presence of a nonreactive gas, and the nonreactive gas is dispersed as fine cells to form an air bubble dispersion. When the prepolymer is in a solid form at a normal temperature, the prepolymer is used after melted by pre-heating to an appropriate temperature.

2) Curing Agent (Chain Extender) Mixing Step

A chain extender (second component) is added to the air bubble dispersion, followed by mixing under stirring to give a foaming reaction solution.

3) Casting Step

The foaming reaction solution is poured into a mold.

4) Curing Step

The foaming reaction solution poured into the mold is reaction-cured by heating.

The nonreactive gas to be used for forming fine cells is preferably not combustible, and specific examples thereof include noble gases such as nitrogen, oxygen, a carbon dioxide gas, a rare gas such as helium and argon, and a mixed gas thereof, and air dried to remove water is most preferable in respect of cost.

As a stirrer for dispersing the nonreactive gas in the form of fine air bubbles into the silicone-based surfactant-containing isocyanate-terminated prepolymer, known stirrers can be used without particular limitation, and specific examples thereof include a homogenizer, a dissolver and a twin-screw planetary mixer. There is no particular limitation on the shape of a stirring blade of the stirrer, and a whipper-type stirring blade is preferably used because fine air bubbles are obtained.

In a preferable aspect, different stirrers are used in stirring for forming the air bubble dispersion in the stirring step and in stirring for mixing the added chain extender in the mixing step. In particular, stirring in the mixing step may not be stirring for forming air bubbles, and a stirrer not generating incorporation of large air bubbles is preferably used. Such a stirrer is preferably a planetary mixer. The same stirrer may be used in the stirring step and the mixing step, and stirring conditions such as rotation rate of the stirring blade are preferably regulated as necessary.

In the method of producing the polyurethane foam, heating and post-curing of the foam obtained after casting the foaming reaction solution into a mold and reacting it until the solution lost fluidity are effective in improving the physical properties of the foam, and are extremely preferable. The foaming reaction solution may be poured into a mold and immediately post-cured in a heating oven, and even under such conditions, heat is not immediately conducted to the reactive components, and thus the diameters of cells are not increased. The curing reaction is preferably conducted at normal pressure to stabilize the shape of cells.

In the production of the polyurethane resin, a known catalyst for promoting a polyurethane reaction, such as tertiary amine- or organotin-based catalysts, may be used. The type and amount of the catalyst added are selected in consideration of flow time in casting in a predetermined mold after the mixing step.

The production of the polyurethane foam may be in a batch system where each component is weighed out, charged into a vessel and mixed or in a continuous production system where each component and a nonreactive gas are continuously supplied to and stirred in a stirring apparatus and the resulting air bubble dispersion is sent to produce molded articles.

An average cell diameter of a polyurethane foam is preferably in the range of from 30 to 80 μm and more preferably in the range of from 30 to 60 μm. If an average cell diameter falls outside the range, a tendency arises that a polishing rate is decreased and a planarity of a material to be polished (a wafer) after polishing is reduced.

Preferably, the polyurethane foam has a specific gravity ranging from 0.5 to 1.3. When the specific gravity is less than 0.5, the surface strength of the polishing region decreases, so that the planarity of the material to be polished tends to decrease. When the specific gravity is larger than 1.3, the cell number on the surface of the polishing region decreases, so that the polishing rate tends to decrease despite excellent planarity.

Preferably, the polyurethane foam has a hardness measured by ASKER D hardness meter, ranging from 45 to 70 degrees. When the ASKER D hardness is less than 45 degrees, the planarity of the material to be polished decreases, while when the hardness is more than 70 degrees, the uniformity of the material to be polished tends to decrease despite excellent planarity.

The polishing region 8 is produced by cutting the polyurethane foam prepared as described above into pieces of predetermined size.

The polishing region 8 is preferably provided with an uneven structure (grooves, holes) for holding and renewing a slurry, on the surface of the polishing side contacting with the wafer. In the case where the polishing region is formed with a fine foam, many openings are on the polishing surface and work so as to hold the slurry. The uneven structure is preferably provided on the surface of the polishing side in order to effectively achieve more holdability and renewal of the slurry, and to prevent induction of dechuck error due to adsorption of the wafer, breakage of a wafer or decrease in polishing efficiency. There is no particular limitation on the shape of the uneven structure as long as the structure is such that the slurry is retained and renewed, and examples thereof include XY latticed grooves, concentric circle-shaped grooves, through holes, non-through holes, polygonal prism, cylinder, spiral grooves, eccentric grooves, radial grooves, and a combination of these grooves. There is no particular limitation on the groove pitch, groove width and groove thickness, and they are appropriately selected to form the structure. These uneven structures are generally those having regularity, and the groove pitch, groove width and groove depth can also be changed at each certain region in order to make holdability and renewal of the slurry desirable.

There is no particular limitation on the thickness of the polishing region 8, and the thickness thereof is usually about 0.8 to 4 mm, and preferably 1.5 to 2.5 mm. Examples of the method of preparing the polishing region of this thickness include a method wherein a block of the fine-cell foam is cut in predetermined thickness by a slicer in a bandsaw system or a planing system, a method that involves casting resin into a mold having a cavity of predetermined thickness and curing the resin, and a method of using coating techniques and sheet molding techniques.

The cushion layer 11 compensates for characteristics of the polishing region. The cushion layer is required for satisfying both planarity and uniformity which are in a tradeoff relationship in CMP. Planarity refers to flatness of a pattern region upon polishing a material to be polished having fine unevenness generated upon pattern formation, and uniformity refers to the uniformity of the whole of a material to be polished. Planarity is improved by the characteristics of the polishing region, while uniformity is improved by the characteristics of the cushion layer. The cushion layer in the polishing pad of the present invention is preferably softer than the polishing region.

There is no particular limitation on the material for forming the cushion layer 11, and examples of such a material include a nonwoven fabric such as a polyester nonwoven fabric, a nylon nonwoven fabric or an acrylic nonwoven fabric; a nonwoven fabric impregnated with a resin, such as a polyester nonwoven fabric impregnated with polyurethane; a polymer resin foam such as polyurethane foam or polyethylene foam; a rubber resin such as a butadiene rubber or an isoprene rubber; and a photosensitive resin.

The support film 12 is a film in which an adhesive layer is provided on one surface or both surfaces of the resin film. Examples of the material of the resin film include polyester such as polyethylene terephthalate; polyethylene; polypropylene; polystyrene; polyimide; polyvinyl alcohol; polyvinyl chloride; fluorine-containing resin such as polyfluoroethylene; nylon; cellulose; general purpose engineering plastic such as polycarbonate; special engineering plastic such as polyetherimide, polyether ether ketone, and polyether sulfone; and the like. The composition of the adhesive layer includes, for example, a rubber-based adhesive agent, an acrylic adhesive agent, and the like. The adhesive layer is provided so as to bond the support film 12 to the cushion layer 11 or the polishing platen 2, and to bond the peripheral part 13 of the light-transmitting region 9 to the support film 12.

The thickness of the resin film is not particularly limited, but it is preferably about 20 to 200 μm in view of the strength and the like.

The production method of the polishing pad 1 of the present invention is not particularly limited, and various methods may be considered. Specific examples thereof will be described hereinafter.

Case 1

The polishing region 8 and the cushion layer 11 are bonded to each other, and then the opening part 10 that passes through the polishing region 8 and the cushion layer 11 is formed. Then, the support film 12 is bonded onto one surface of the cushion layer 11. The light-transmitting region 9 is fittingly inserted into the opening part 10 and the peripheral part 13 of the light-transmitting region 9 is bonded onto the support film 12. In addition, a part of the support film 12, which is corresponding to the recessed part 14 of the light-transmitting region 9, is removed by cutting, thereby to open the recessed part 14.

Case 2

The polishing region 8 and the cushion layer 11 are bonded to each other, and then the opening part 10 that passes through the polishing region 8 and the cushion layer 11 is formed. Then, the support film 12 is bonded onto one surface of the cushion layer 11. A light-transmitting resin composition is injected onto the support film 12 in the opening part 10, and cured by heating, light irradiation, moisture or the like, thereby to form the light-transmitting region 9. In addition, a part of the support film 12, which is corresponding to the recessed part 14 of the light-transmitting region 9, is removed by cutting, and the recessed part 14 is formed by cutting and the like.

Figure 3:
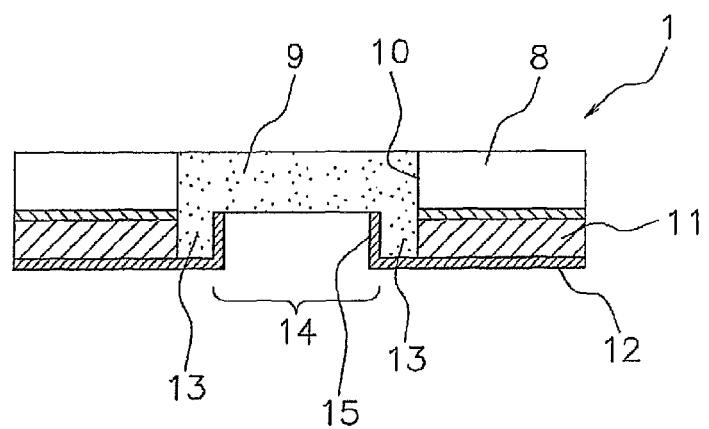
FIG. 3 is a schematic sectional view showing another example of a structure of the polishing pad of the present invention.

As shown in FIG. 3, a covering member 15 may be provided on the side surface of the recessed part 14. There is no particular limitation on the method for providing the covering member 15, and examples thereof include a method of bonding resin sheets to each other, a method of applying a resin composition or an adhesive agent to the side surface of the recessed part, followed by curing, and the like. However, in order to reliably prevent slurry leakage and from the viewpoint of production efficiency, a method for bonding a covering member to the side surface of the recessed part 14 by bending the end part of the support film 12 that is layered in the peripheral part 13 is preferred.

Examples of the means for bonding the polishing region onto the cushion layer include a method for pressing the polishing region and the cushion layer with a double sided tape sandwiched therebetween. The double sided tape has a general structure wherein an adhesive layer is provided on both surfaces of a base material such as a nonwoven fabric or a film. The composition of the adhesive layer includes, for example, a rubber-based adhesive agent and an acrylic adhesive agent. In consideration of the content of metallic ions, an acrylic adhesive is preferable because of a lower content of metallic ions. Because the polishing region and the cushion layer can be different in composition, the composition of each adhesive layer of the double sided tape can be different to make the adhesive strength of each layer suitable.

There is no particular limitation on the means for forming an opening part in the polishing region and the cushion layer, and examples thereof include a method for boring of the polishing region and the cushion layer by pressing or grinding with a cutting tool, a method using laser such as carbon dioxide gas laser, and the like. There is no particular limitation on the size and shape of the opening part.

Figure 1:
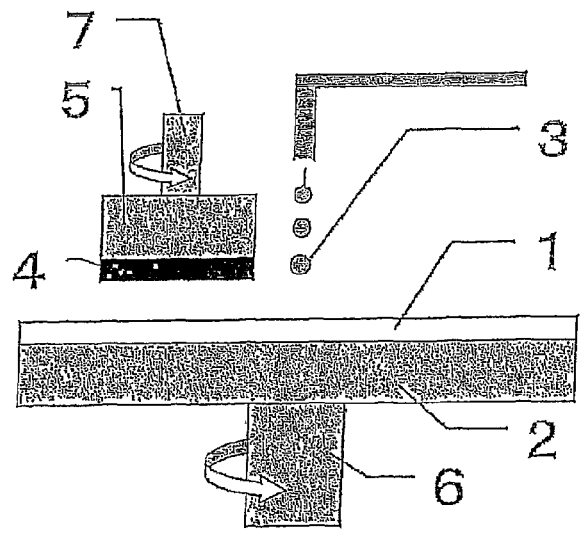
FIG. 1 is a schematic view showing one example of a polishing apparatus used in CMP polishing.

A semiconductor device is produced through the step of polishing a surface of a semiconductor wafer using the polishing pad. The semiconductor wafer is generally obtained by laminating a wiring metal and an oxide film on a silicone wafer. There is no limitation on the polishing method and polishing apparatus of the semiconductor wafer. For example, as shown in FIG. 1, polishing is carried out using a polishing apparatus provided with a polishing platen 2 for supporting a polishing pad 1, a supporting stand (polishing head) 5 for supporting a polished wafer 4, a backing material for uniformly pressurizing a wafer, and a mechanism of feeding an abrasive 3. The polishing pad 1 is fitted with the polishing platen 2, for example, by sticking with a double-sided tape. The polishing platen 2 and the supporting stand 5 are provided with rotating shafts 6 and 7, respectively, and are arranged such that the polishing pad 1 and the polished material 4, both of which are supported by them, are opposed to each other. The supporting stand 5 is provided with a pressurizing mechanism for pressing the polished material 4 against the polishing pad 1. In the case of polishing, while rotating the polishing platen 2 and the supporting stand 5, polishing is carried out by pressing the semiconductor wafer 4 against the polishing pad 1 with feeding a slurry. There is no limitation on the flow rate of a slurry, polishing load, rotation number of a polishing platen and rotation number of wafer, and polishing is carried out by appropriately adjusting.

Protrusions on the surface of the semiconductor wafer 4 are thereby removed and polished flatly. Thereafter, a semiconductor device is produced therefrom through dicing, bonding, packaging and the like. The semiconductor device is used in an arithmetic processor, a memory and the like.

EXAMPLES

Hereinafter, the Examples illustrating the constitution and effect of the present inventions are described.

[Measurement and Evaluation Method]

(Measurement of Average Cell Diameter)

The prepared polyurethane foam was sliced with a microtome cutter into measurement samples each with the thinnest possible thickness of 1 mm or less. A surface of a sample was photographed with a scanning electron microscope (S-3500N, Hitachi Science Systems Co., Ltd.) at a magnification of ×100. An effective circular diameter of each of all cells in an arbitrary area was measured with an image analyzing soft (manufactured by MITANI Corp. with a trade name WIN-ROOF) and an average cell diameter was calculated from the measured values.

(Measurement of Specific Gravity)

Determined according to JIS Z8807-1976. A manufactured polyurethane foam cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).

(Measurement of Hardness)

Measurement is conducted according to JIS K6253-1997. A manufactured polyurethane foam cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D hardness meter, manufactured by Kobunshi Keiki Co., Ltd.) was used to measure hardness.

Example 1

Preparation of Light-Transmitting Region

A thermoplastic polyurethane A1098A (manufactured by Toyobo Co., Ltd.) was used and subjected to injection molding to prepare a polyurethane sheet (length: 59.5 mm, width: 19.5 mm, thickness: 2.0 mm, D hardness: 48 degrees). The polyurethane sheet was further subjected to cutting process to form a recessed part (length: 54 mm, width: 14 mm, depth: 0.8 mm), so that a light-transmitting region was prepared.

Preparation of Polishing Region

In a reaction vessel, 100 parts by weight of a polyether-based prepolymer (Adiprene L-325, manufactured by Uniroyal Chemical Corporation, with an NCO concentration of 2.22 meq/g) was mixed with 3 parts by weight of a silicone-based nonionic surfactant (SH192, manufactured by Dow Corning Toray Silicone Co., Ltd.), and then the temperature of the mixture was controlled at 80° C. The mixture was vigorously stirred at a rotation number of 900 rpm for about 4 minutes with a stirring blade so that air bubbles were incorporated into the reaction system. To the reaction system, 26 parts by weight of 4,4'-methylenebis(o-chloroaniline) (IHARACUAMINE MT, manufactured by IHARA CHEMICAL INDUSTRY CO., LTD.) melted at 120° C. in advance was added. Thereafter, the reaction system was continuously stirred for about 1 minute and the reaction solution was poured into a pan type open mold. When the reaction solution lost fluidity, it was put into an oven and postcured at 110° C. for 6 hours to obtain a polyurethane foam block. The polyurethane foam block was sliced with a bandsaw type slicer (manufactured by Fecken-Kirfel) to obtain a polyurethane foam sheet (having an average cell diameter of 50 µm, a specific gravity of 0.82 and a hardness D of 55 degrees). Then, the sheet was surface-buffed to a predetermined thickness with a buffing machine (manufactured by AMITEC Corporation) to obtain a sheet with an adjusted thickness precision (having a thickness of 2 mm). The buff-treated sheet was punched into a disc with a diameter of 61 cm, and grooving was performed on the surface of the disc using a grooving machine (manufactured by Toho Koki Co., Ltd.) to form concentric circular grooves. A double sided tape (a double tack tape, manufactured by Sekisui Chemical Co., Ltd.) was bonded onto a surface, which was opposite to the groove processed surface of the sheet with a laminator, thereby to prepare a polishing region attached with a double sided tape.

Preparation of Polishing Pad

A cushion layer made of a corona-treated polyethylene foam (TORAYPEF with a thickness of 0.8 mm, manufactured by TORAY INDUSTRIES, INC.), a surface of which was buffed, was bonded onto an adhesive surface of the polishing region attached with a double sided tape by using a laminator, thereby to prepare a polishing sheet. Then, an opening part with a size of 60 mm×20 mm was formed in the polishing sheet. A support film (polyethylene terephthalate with a thickness of 50 µm) having an adhesive layer on one surface was bonded onto the cushion layer of the polishing sheet, thereby to obtain a laminate. Thereafter, a light-transmitting region was fittingly inserted into the opening part of the laminate, and the peripheral part of the rear-surface side of the light-transmitting region was bonded onto the support film. Then, the support film layered in the recessed part of the rear-surface side of the light-transmitting region was removed by cutting, and the end part of the support film was bent to bond the end part to the side surface of the recessed part so that a polishing pad having a structure as shown in FIG. 3 was prepared. The polishing pad did not cause slurry leakage even if 15 pieces of dummy wafers were polished.

DESCRIPTION OF REFERENCE SIGN

1: Polishing pad
2: Polishing platen
3: Abrasive (Slurry)
4: Material to be polished (Semiconductor wafer)
5: Supporting stand (Polishing head)
6, 7: Rotating shafts
8: Polishing region
9: Light-transmitting region
10: Opening part
11: Cushion layer
12: Support film
13: Peripheral part
14: Recessed part
15: Covering member

The invention claimed is:
1. A polishing pad comprising a polishing region, a cushion layer, and a support film layered in this order, wherein
a light-transmitting region is provided on the support film and in an opening part that passes through the polishing region and the cushion layer;
the light-transmitting region is a window constituted by a light-transmitting resin passing through the polishing region and the cushion layer in the opening part, and has a peripheral part and a recessed part on a surface of a polishing platen-side, wherein a bottom surface of the peripheral part of the light-transmitting resin is flush with a bottom surface of the cushion layer;

the support film is layered on and attached to the bottom surface of the peripheral part and the bottom surface of the cushion layer; and the support film is not layered on nor attached to a top surface of the recessed part, which remains open.

2. The polishing pad according to claim 1, wherein a covering member is provided on the side surface of the recessed part.

3. The polishing pad according to claim 2, wherein the covering member is formed by bending an end part of the support film layered on the peripheral part.

4. A method for producing a semiconductor device, comprising the step of polishing the surface of a semiconductor wafer by using the polishing pad according to claim 1.

5. A method for producing a semiconductor device, comprising the step of polishing the surface of a semiconductor wafer by using the polishing pad according to claim 2.

6. A method for producing a semiconductor device, comprising the step of polishing the surface of a semiconductor wafer by using the polishing pad according to claim 3.

* * * * *